United States Patent
Li et al.

(10) Patent No.: US 10,564,333 B2
(45) Date of Patent: Feb. 18, 2020

(54) COLOR FILTER SUBSTRATE, MANUFACTURING METHOD THEREOF, AND DISPLAY DEVICE

(71) Applicant: BOE TECHNOLOGY GROUP CO., LTD., Beijing (CN)

(72) Inventors: Mingchao Li, Beijing (CN); Fangzhen Zhang, Beijing (CN); Peilin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 321 days.

(21) Appl. No.: 15/022,066

(22) PCT Filed: Nov. 17, 2015

(86) PCT No.: PCT/CN2015/094755
§ 371 (c)(1),
(2) Date: Mar. 15, 2016

(87) PCT Pub. No.: WO2016/107312
PCT Pub. Date: Jul. 7, 2016

(65) Prior Publication Data
US 2016/0356930 A1 Dec. 8, 2016

(30) Foreign Application Priority Data
Dec. 30, 2014 (CN) .......................... 2014 1 0841715

(51) Int. Cl.
*G03F 7/40* (2006.01)
*G02B 5/20* (2006.01)
(Continued)

(52) U.S. Cl.
CPC .......... *G02B 5/201* (2013.01); *G02F 1/13338* (2013.01); *G03F 7/40* (2013.01);
(Continued)

(58) Field of Classification Search
CPC .. G02B 5/20; G02B 5/201; G03F 7/40; G06F 3/044; G06F 2203/04103; G02F 1/1335;
(Continued)

(56) References Cited

U.S. PATENT DOCUMENTS 5,910,829 A * 6/1999 Shimada ............ G02F 1/133512
349/106
2005/0259210 A1 * 11/2005 Lee .................... G02F 1/134363
349/156
(Continued)

FOREIGN PATENT DOCUMENTS

CN 101825815 A 9/2010
CN 102955288 A 3/2013
(Continued)

OTHER PUBLICATIONS

Office action dated Nov. 30, 2016 for corresponding CN application 201410841715.X with English translation.
(Continued)

*Primary Examiner* — Hovhannes Baghdasaryan
*Assistant Examiner* — Amie M Ndure
(74) *Attorney, Agent, or Firm* — Nath, Goldberg & Meyer; Joshua B. Goldberg; Daniel Bissing

(57) ABSTRACT

The embodiments of the invention provide a color filter substrate and a manufacturing method thereof, and a display device, belonging to the field of display technology. Manufacturing the display device by using the above color filter substrate can simplify the manufacturing process and reduce the cost. The manufacturing method of the color filter substrate comprises: performing a single patterning process to form patterns of a plurality of first black matrixes and second black matrixes which are horizontally and longitudinally intersected, and patterns of a plurality of first touch electrodes positioned on surfaces of the second black
(Continued)

matrixes away from a base substrate, wherein the patterns of the first black matrixes and the second black matrixes are intersected to define a plurality of color filter regions arranged in a form of matrix; and forming patterns of color filter layers within the color filter regions.

18 Claims, 7 Drawing Sheets

(51) Int. Cl.
    *G06F 3/044*     (2006.01)
    *G02F 1/1333*     (2006.01)
    *G02F 1/1335*     (2006.01)
    *G03F 7/00*     (2006.01)
    *G02F 1/1362*     (2006.01)

(52) U.S. Cl.
    CPC ........ *G06F 3/044* (2013.01); *G02F 1/133512* (2013.01); *G02F 2001/136236* (2013.01); *G03F 7/0007* (2013.01); *G06F 2203/04103* (2013.01)

(58) Field of Classification Search
    CPC ............. G02F 1/1343; G02F 1/133707; G02F 1/134309
    See application file for complete search history.

(56) References Cited

U.S. PATENT DOCUMENTS

| | | | | |
|---|---|---|---|---|
| 2008/0212220 | A1* | 9/2008 | Shim | G02B 5/201 359/891 |
| 2009/0218548 | A1* | 9/2009 | Kato | H01B 1/127 252/500 |
| 2010/0225609 | A1* | 9/2010 | Huang | G02F 1/13338 345/173 |
| 2010/0289977 | A1* | 11/2010 | Liu | G02F 1/1362 349/44 |
| 2011/0228188 | A1 | 9/2011 | Kim et al. | |
| 2013/0135193 | A1* | 5/2013 | Fike, III | G02B 26/00 345/156 |
| 2013/0271707 | A1* | 10/2013 | Sakamoto | G02F 1/139 349/106 |
| 2014/0055878 | A1* | 2/2014 | Niu | G02F 1/133516 359/891 |
| 2014/0125879 | A1* | 5/2014 | Chiu | G02F 1/13338 349/12 |
| 2014/0125880 | A1* | 5/2014 | Tsai | G02F 1/13338 349/12 |
| 2014/0362042 | A1* | 12/2014 | Noguchi | G06F 3/0412 345/174 |
| 2015/0029148 | A1 | 1/2015 | Wang et al. | |
| 2015/0060252 | A1* | 3/2015 | Wang | H03K 17/9622 200/5 R |
| 2015/0253912 | A1* | 9/2015 | Liu | G06F 1/16 345/174 |
| 2016/0026311 | A1* | 1/2016 | Wang | G06F 3/044 345/173 |
| 2016/0077624 | A1* | 3/2016 | Zhao | H04L 45/245 345/174 |

FOREIGN PATENT DOCUMENTS

| | | |
|---|---|---|
| CN | 103309503 A | 9/2013 |
| CN | 103309536 A | 9/2013 |
| CN | 103792711 A | 5/2014 |
| CN | 104483776 A | 4/2015 |
| WO | 2014153816 A1 | 10/2014 |

OTHER PUBLICATIONS

Form PCT/ISA/210 issued in corresponding international application No. PCT/CN2015/094755 dated Jan. 25, 2016.
Form PCT/ISA/220 issued in corresponding international application No. PCT/CN2015/094755 dated Jan. 26, 2016.
Form PCT/ISA/237 issued in corresponding international application No. PCT/CN2015/094755 dated Jan. 25, 2016.
Extended European search report dated Jun. 25, 2018 for corresponding application No. 15839119.3.

* cited by examiner

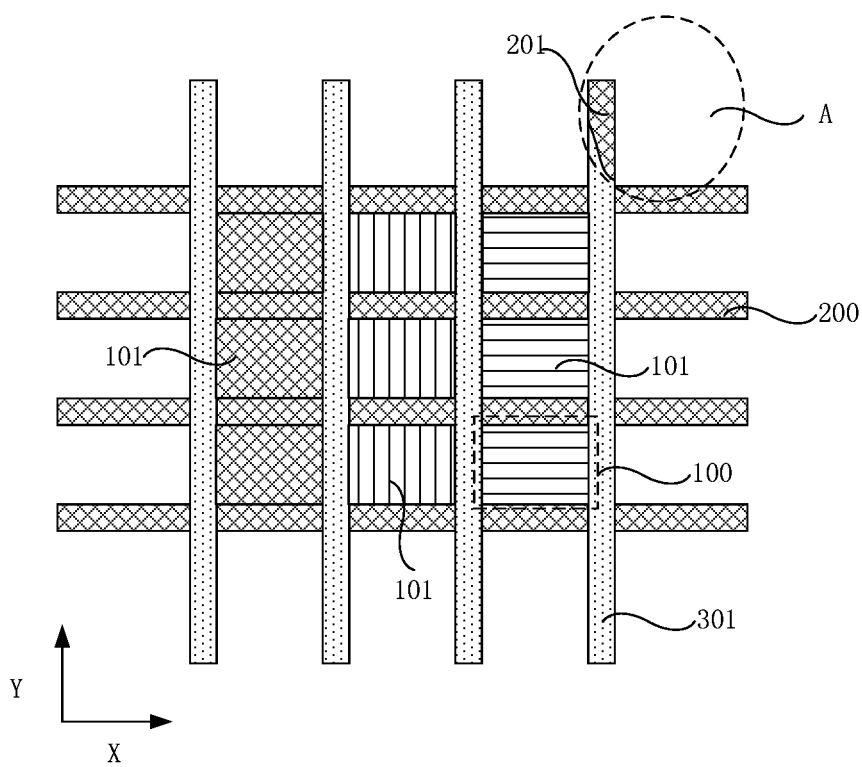

Fig. 3

| | |
|---|---|
| applying photoresist on a surface of the conducting layer; forming first photoresist completely retained regions, first photoresist partially retained regions and first photoresist completely removed regions by performing a single exposure and development process through a two-tone mask, wherein the first photoresist completely retained regions correspond to the patterns of the second black matrixes and the first touch electrodes to be formed; the first photoresist partially retained regions correspond to the patterns of the first black matrixes to be formed; and the first photoresist completely removed regions correspond to the color filter regions to be formed | S201 |
| etching parts of the conducting layer and the light blocking layer corresponding to the first photoresist completely removed regions to form the color filter regions | S202 |
| removing the photoresist in the first photoresist partially retained regions, and etching parts of the conducting layer corresponding to the first photoresist partially retained regions to form the patterns of the first black matrixes | S203 |
| stripping off the photoresist in the first photoresist completely retained regions to form the patterns of the first touch electrodes and the second black matrixes | S204 |

Fig. 4

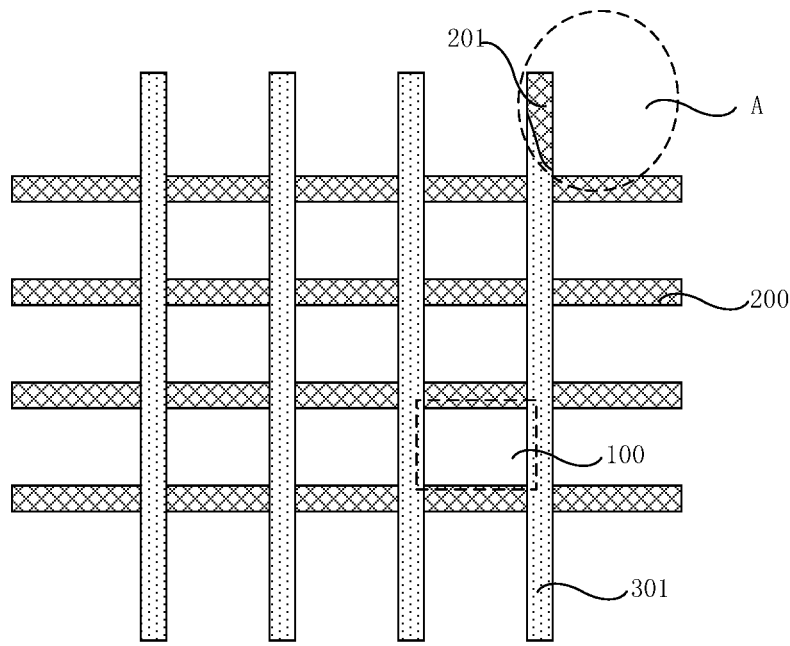

Fig. 5d

| applying photoresist on a surface of the conducting layer; forming second photoresist completely retained regions, second photoresist partially retained regions and second photoresist completely removed regions by performing a single exposure and development process through a two-tone mask of another pattern, wherein the second photoresist completely retained regions correspond to the patterns of the second black matrixes and the first touch electrodes to be formed and partial regions of the patterns of the first black matrixes positioned between patterns of two adjacent second black matrixes; the second photoresist partially retained regions correspond to another partial regions of the patterns of the first black matrixes between the patterns of two adjacent second black matrixes to be formed; and the second photoresist completely removed regions correspond to the color filter regions to be formed — S301 |

| etching parts of the conducting layer and the light blocking layer corresponding to the second photoresist completely removed regions to form the color filter regions — S302 |

| removing the photoresist in the second photoresist partially retained regions, and etching parts of the conducting layer corresponding to the second photoresist partially retained regions to form clearance regions corresponding to another partial regions of the patterns of the first black matrixes — S303 |

| stripping off the photoresist in the second photoresist completely retained regions to form the patterns of the first touch electrodes, the second black matrixes and virtual layers corresponding to part of the patterns of the first black matrixes — S304 |

Fig. 6 ns and a plurality of second black matrixes which are horizontally and longitudinally intersected and formed by the light blocking layer, and patterns of a plurality of first touch electrodes positioned on surfaces of the second black matrixes away from the base substrate and formed by the conducting layer, wherein the patterns of the first black matrixes and the second black matrixes are intersected to define a plurality of color filter regions arranged in a form of matrix; and
COLOR FILTER SUBSTRATE, MANUFACTURING METHOD THEREOF, AND DISPLAY DEVICE This is a National Phase Application filed under 35 U.S.C. 371 as a national stage of PCT/CN2015/094755 filed on Nov. 17, 2015, an application claiming the benefit of Chinese Application No. 201410841715.X filed on Dec. 30, 2014, the content of each of which is hereby incorporated by reference in its entirety.

FIELD OF THE INVENTION

The invention relates to the field of display technology, and particularly to a color filter substrate and a manufacturing method thereof, and a display device.

BACKGROUND OF THE INVENTION

With the rapid development of display technology, touch panel (TP for short) is increasingly applied to the field of high-performance display due to its characteristics such as intuition, easy operation and the like.

The touch panel includes an Add On touch panel and an In Cell touch panel.

At present, the touch sensing method of the in cell touch panel is mainly based on mutual capacitance. The mutual-capacitance type in cell touch panel includes a color filter substrate and an array substrate arranged opposite to each other, wherein the touch driving electrode and the touch sensing electrode are arranged on the array substrate. The touch principle is that: when loading a touch driving signal to the touch driving electrode, a sensing voltage signal coupled by the touch sensing electrode via a mutual capacitor is detected. During this process, when a user contacts the touch panel, the electric field of a human body will act on the mutual capacitor to enable variation of the capacitance of the mutual capacitor, so that the sensing voltage signal coupled by the touch sensing electrode via the mutual capacitor is changed, and thereby a position of a contact point can be determined according to the variation of the sensing voltage signal.

As the touch sensing electrode of the in cell touch panel is arranged on the array substrate, the touch sensing electrode is positioned away from the external touch position, thus the touch sensitivity is lowered, and thereby interference and noise are generated between the display signal and the touch signal of the touch panel.

In order to solve the above problem, the touch sensing electrode is generally formed on the color filter substrate in the prior art, and a black matrix formed of metal material, an insulating layer, a color resin layer and a touch driving electrode are successively formed on the touch sensing electrode at a side of close to the array substrate. The metal black matrix can function as bridging the touch sensing electrode and the touch driving electrode, so that the touch sensitivity of the touch panel is improved. However, it is complex in the process and high in cost to manufacture the display device by using the above color filter substrate.

SUMMARY OF THE INVENTION

The embodiments of the invention provide a color filter substrate and a manufacturing method thereof, and a display device. Manufacturing the display device with the color filter substrate in the present invention can simplify the manufacturing process and reduce the cost.

In order to achieve the aforementioned object, the embodiments of the invention adopt the following technical solutions:

One aspect of the embodiments of the invention provides a manufacturing method of a color filter substrate, including the following steps:

forming a light blocking layer and a conducting layer successively on a base substrate;

on a surface of the base substrate formed with the above structure, forming, by a single patterning process, patterns of a plurality of first black matrixes and a plurality of second black matrixes which are horizontally and longitudinally intersected and formed by the light blocking layer, and patterns of a plurality of first touch electrodes positioned on surfaces of the second black matrixes away from the base substrate and formed by the conducting layer, wherein the patterns of the first black matrixes and the second black matrixes are intersected to define a plurality of color filter regions arranged in a form of matrix; and forming patterns of color filter layers within the color filter regions.

Another aspect of the embodiments of the invention provides a color filter substrate, including:

a base substrate;

a plurality of first black matrixes and a plurality of second black matrixes which are positioned on a surface of the base substrate and horizontally and longitudinally intersected, and a plurality of first touch electrodes positioned on surfaces of the second black matrixes away from the base substrate, wherein the patterns of the first touch electrodes and the second black matrixes are consistent, and the first black matrixes and the second black matrixes are intersected to define a plurality of color filter regions arranged in a form of matrix; and color filter layers positioned within the color filter regions.

Yet another aspect of the embodiments of the invention provides a display device, including the aforementioned color filter substrate.

The embodiments of the invention provide a color filter substrate and a manufacturing method thereof, and a display device. The manufacturing method of the color filter substrate includes: performing a single patterning process to form patterns of a plurality of first black matrixes and a plurality of second black matrixes which are horizontally and longitudinally intersected, and patterns of a plurality of first touch electrodes positioned on surfaces of the second black matrixes away from the base substrate, wherein the patterns of the first black matrixes and the second black matrixes are intersected to define a plurality of color filter regions arranged in a form of matrix; and forming patterns of color filter layers within the color filter regions. Thus, the first touch electrodes can be manufactured while the black matrixes (including first black matrixes and second black matrixes) are formed. Therefore, the manufacturing process can be simplified, the manufacturing efficiency can be improved and the cost can be reduced in manufacturing the display device by using the above color filter substrate.

BRIEF DESCRIPTION OF THE DRAWINGS

In order to more clearly illustrate the technical solutions in the embodiments of the invention or the prior art, drawings to be used in the description of the embodiments or the prior art will be introduced briefly hereinafter. Obviously, drawings in the following description are merely some embodiments of the invention. To those of ordinary skill in the art, other drawings can be obtained according to these drawings without creative labor.

FIG. 3 is a structural diagram of a color filter substrate provided in an embodiment of the invention;

FIG. 4 is a flowchart of a manufacturing method of another color filter substrate provided in an embodiment of the invention;

FIG. 5d is a structural diagram of another color filter substrate provided in an embodiment of the invention;

FIG. 6 is a flowchart of a manufacturing method of yet another color filter substrate provided in an embodiment of the invention;

DETAILED DESCRIPTION OF THE EMBODIMENTS

The technical solutions in the embodiments of the invention will be clearly and completely described hereinafter in combination with drawings in the embodiments of the invention. Obviously, the described embodiments are merely part of the embodiments of the invention, not all the embodiments. Based on the embodiments of the invention, all other embodiments obtained by those of ordinary skill in the art without creative labor belong to the protection scope of the invention.

Figure 1:
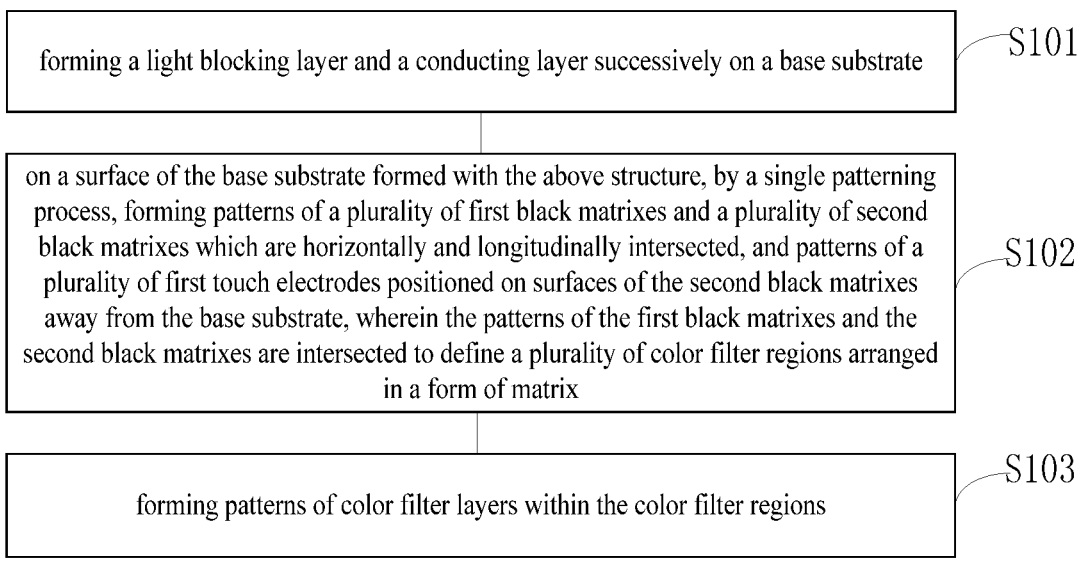
FIG. 1 is a flowchart of a manufacturing method of a color filter substrate provided in an embodiment of the invention.

An embodiment of the invention provides a manufacturing method of a color filter substrate, as shown in FIG. 1, which may include steps S101 to S103 as below.

Figure 2:
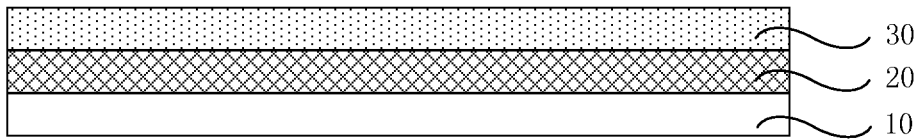
FIG. 2 is a diagram of a structure obtained in a manufacturing process of a color filter substrate provided in an embodiment of the invention.

S101, as shown in FIG. 2, a light blocking layer 20 and a conducting layer 30 are successively formed on a base substrate 10.

S102, as shown in FIG. 3, a single patterning process is performed on the light blocking layer 20 and the conducting layer 30 to form patterns (as shown in the partial section A in FIG. 3) of a plurality of first black matrixes 200 and a plurality of second black matrixes 201,which are horizontally and longitudinally intersected, and a pattern of a plurality of first touch electrodes 301 positioned on surfaces of the patterns of the second black matrixes 201 away from the base substrate 10, wherein the patterns of the first black matrixes 200 and the second black matrixes 201 are intersected to define a plurality of color filter regions 100 arranged in the form of matrix.

S103, patterns of color filter layers 101 are formed within the color filter regions 100.

It needs to be noted that first, in the invention, the patterning process may include a photolithography process, or include the photolithography process and an etching step, and may also include other processes such as printing and ink jet for forming predetermined figures; the photolithography process refers to a process including film formation, exposure and developing, for forming figures by using photoresist, masks, exposure machines, etc. A corresponding patterning process may be selected according to a structure to be formed in the invention. The single patterning process in the embodiment of the invention is described by using an example of forming different exposed regions through a single mask exposure process, carrying out multiple removing processes of etching and ashing on the different exposed regions to finally obtain expected patterns.

Second, both the first black matrixes 200 and the second black matrixes 201 are formed by the light blocking layer 20. The arranging manners are different in that the plurality of first black matrixes 200 are arranged in parallel with each other along a horizontal direction X, and the plurality of second black matrixes 201 are arranged in parallel with each other along a vertical direction Y. The first black matrixes 200 and the second black matrixes 201 are used to shade light to prevent the undesirable phenomenon of light leak of the display device. The horizontal direction X and the vertical direction Y are relative concepts. When view angle changes, the horizontal direction X and the vertical direction Y will be interchanged, for example, when FIG. 3 is rotated by 90 degrees clockwise, the horizontal direction X and the vertical direction Y are interchanged.

Third, as the patterns of the second black matrixes 201 and the first touch electrodes 301 are formed through a single patterning process, the patterns of the second black matrixes 201 and the first touch electrodes 301 are consistent; besides, the first touch electrodes 301 are formed by the conducting layer 30, and the conducting layer 30 is positioned on the surface of the light blocking layer 20.Therefore, as shown in FIG. 3, the formed patterns of the first touch electrodes 301 completely covers the patterns of the second black matrixes 201.

Fourth, each color filter region 100 corresponds to one sub pixel (defined by horizontally and longitudinally intersected gate lines and data lines) on the array substrate (not shown in the figures). The color of the color filter layer 101 within each color filter region 100 is red (R), or green (G) or blue (B). Every three sub pixels on the array substrate corresponding to three adjacent color filter layers 101 of red, green and blue (not limited to the ordering) form one RGB pixel.

The manufacturing method of the color filter layers 101 may be that: coating one layer of color resin material which may be red or green or blue on the surface of the substrate subject to the step S102, then forming a layer of photoresist on the surface of the color resin material, and forming red, green and blue color filter layers 101 by the mask exposure process. In addition, an over coater (OC layer for short) may be coated on the surface of the color filter layers 101, so that the surfaces of the color filter layers 101 are smooth and flat, and step difference of film is reduced.

The embodiment of the invention provides a manufacturing method of a color filter substrate, including: performing a single patterning process to form patterns of a first black matrixes and patterns of a plurality of second black matrixes, which are horizontally and longitudinally intersected, and patterns of a plurality of first touch electrodes positioned on surfaces of the second black matrixes away from the base substrate, wherein the patterns of the first black matrixes and the second black matrixes are intersected to define a plurality of color filter regions arranged in a form of matrix; and forming patterns of color filter layers within the color filter regions. Thus, the first touch electrodes may be manufactured while the black matrixes (including first black matrixes and second black matrixes) are formed. Therefore, the manufacturing process can be simplified, the manufacturing efficiency is improved and the cost is reduced in manufacturing the display device by using the color filter substrate.

Embodiment 1

Further, the step S102, as shown in FIG. 4, may include steps S201 to S204 as below.

Figure 5A:
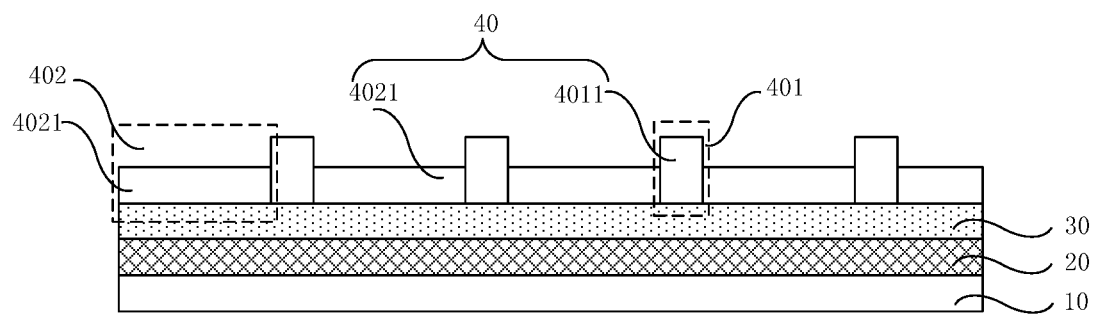
FIGS. 5a-5c are diagrams of structures obtained by respective steps in a manufacturing process of a color filter substrate provided in an embodiment of the invention.

S201, as shown in FIG. 5a, photoresist 40 is applied on the surface of the conducting layer 30; first photoresist completely retained regions 401, first photoresist partially retained regions 402 and first photoresist completely removed regions (not shown in the figures) are formed after a single exposure and development process using a two-tone mask, wherein the first photoresist completely retained regions 401 correspond to the patterns of the second black matrixes 201 and the first touch electrodes 301 to be formed; the first photoresist partially retained regions 402 correspond to the patterns of the first black matrixes 200 to be formed; and the first photoresist completely removed regions correspond to the color filter regions 100 to be formed.

It needs to be noted that the two-tone mask is a semipermeable mask, and photoresist with two different thicknesses may be formed on the surface of the conducting layer 30, that is, thick photoresist 4011 in the first photoresist completely retained region 401, and thin photoresist 4021 in the first photoresist partially retained region 402. The two-tone mask may include a gray-tone mask and a half-tone mask.

S202, parts of the conducting layer 30 and the light blocking layer 20 corresponding to the first photoresist completely removed regions are etched to form the color filter regions 100. During this process, the photoresist 4011 in the first photoresist completely retained regions 401 and the photoresist 4021 in the first photoresist partially retained regions 402 get thinner.

Figure 5B:
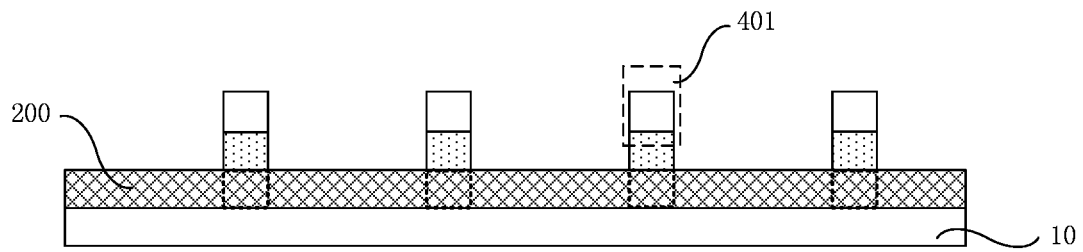

S203, as shown in FIG. 5b, the photoresist 4021 in the first photoresist partially retained regions 402 (such as using an ashing process) are removed, and parts of the conducting layer 30 corresponding to the first photoresist partially retained regions 402 are etched to form the patterns of the first black matrixes 200. During this process, the photoresist 4011 in the first photoresist completely retained regions 401 get thinner.

Figure 5C:
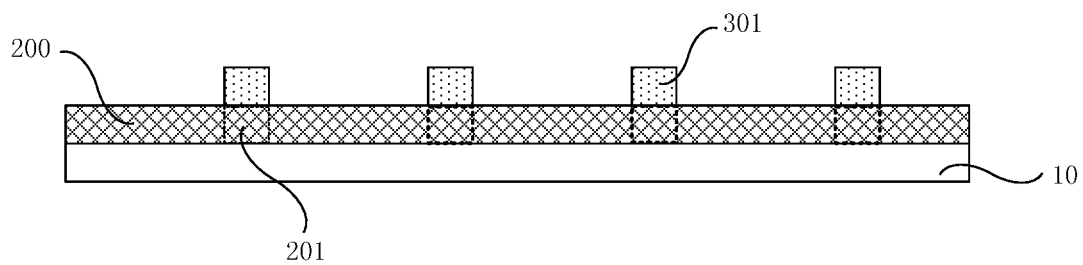

S204, as shown in FIG. 5c, the photoresist 4011 in the first photoresist completely retained regions 401 are stripped off to form the patterns of the first touch electrodes 301 and the second black matrixes 201, a top view being shown in FIG. 5d.

However, on the basis of the manufactured first black matrixes 200, the second black matrixes 201 and the first touch electrodes 301 by using the above method, the color filter layers 101 formed in the step S103 are flush with the first black matrixes 200 or the second black matrixes 201, so as to have a step difference from the first touch electrodes 301, thus a surface, to be aligned and assembled with the array substrate, of the color filter substrate is uneven. Therefore, the present invention also provides another manufacturing method to avoid the above shortcoming. Refer to the embodiment 2 for specific details.

Embodiment 2

Optionally, the step S102, as shown in FIG. 6, may include steps S301 to S304 as below.

Figure 7A:
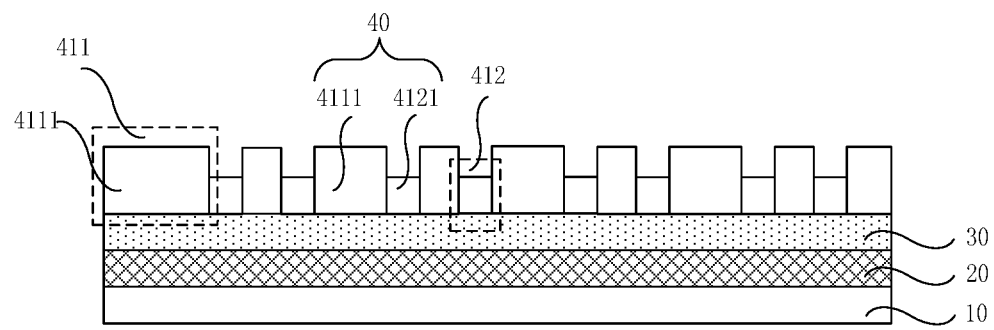
FIGS. 7a-7c are diagrams of structures obtained by respective steps in a manufacturing process of another color filter substrate provided in an embodiment of the invention.

S301, as shown in FIG. 7a, photoresist 40 is applied on the surface of the conducting layer 30; second photoresist completely retained regions 411, second photoresist partially retained regions 412 and second photoresist completely removed regions (not shown in the figures) may be formed after a single exposure and development process is performed through a two-tone mask of another pattern, wherein the second photoresist completely retained regions 411 correspond to the patterns of the second black matrixes 201 and the first touch electrodes 301 to be formed and a part of the patterns of the first black matrixes 200 positioned between patterns of two adjacent second black matrixes 201; the second photoresist partially retained regions 412 correspond to other partial regions of the patterns of the first black matrixes 200 between patterns of two adjacent second black matrixes 201 to be formed; and the second photoresist completely removed regions correspond to the color filter regions 100 to be formed. The partial regions of the patterns of the first black matrixes 200 do not contact the patterns of the second black matrixes 201.

Specifically, through the two-tone mask of another pattern, photoresist with two different thicknesses may be formed on the surface of the conducting layer 30, that is, thick photoresist 4111 in the second photoresist completely retained region 411, and thin photoresist 4121 in the second photoresist partially retained region 412.

S302, parts of the conducting layer 30 and the light blocking layer 20 corresponding to the second photoresist completely removed regions are etched to form the color filter regions 100. During this process, the photoresist 4111 in the second photoresist completely retained regions 411 and the photoresist 4121 in the second photoresist partially retained regions 412 get thinner.

Figure 7B:
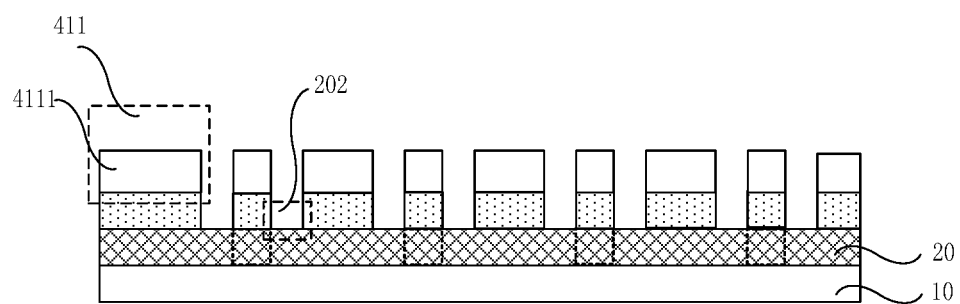

S303, as shown in FIG. 7b, the photoresist 4121 in the second photoresist partially retained regions 412 (such as using an ashing process) are removed, and parts of the conducting layer 30 corresponding to the second photoresist partially retained regions 412 are etched to form clearance regions 202 corresponding to the other partial regions of the pattern of the first black matrixes 200. During this process, the photoresist 4111 in the second photoresist completely retained regions 411 get thinner.

Figure 7C:
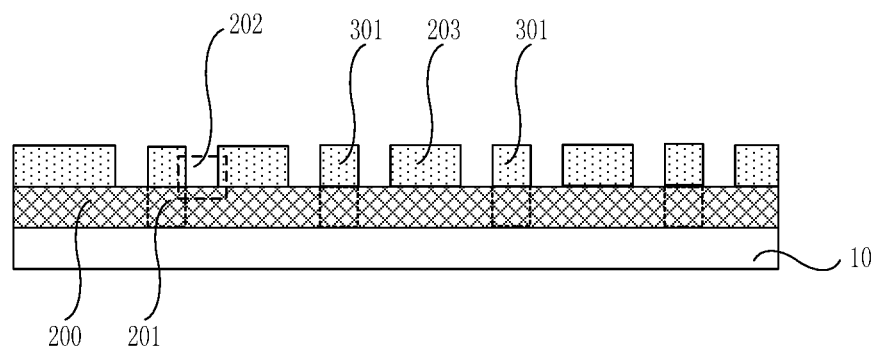
Figure 7D:
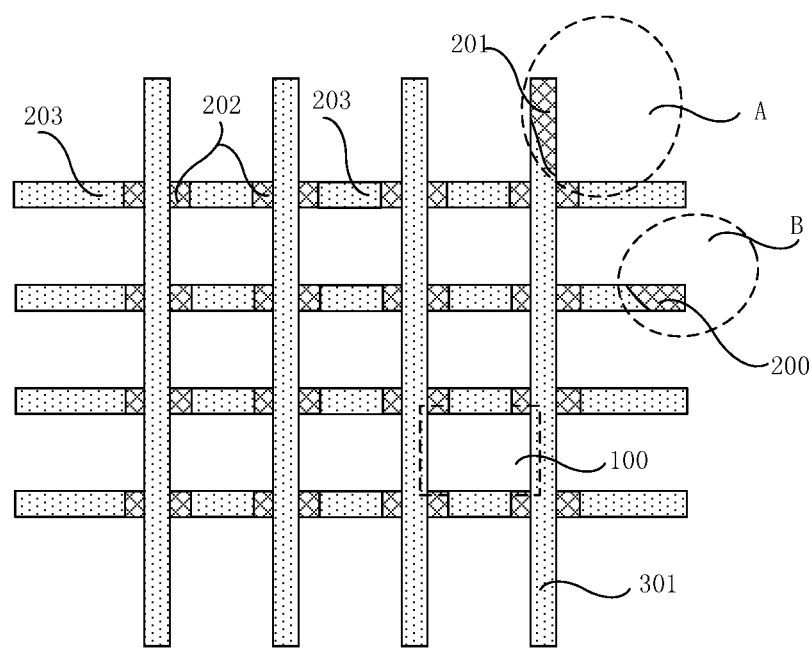
FIG. 7d is a structural diagram of still another color filter substrate provided in an embodiment of the invention.

S304, as shown in FIG. 7c, the photoresist in the second photoresist completely retained regions 411 are stripped off to form patterns of the first touch electrodes 301, the second black matrixes 201 and virtual layers 203 corresponding to the partial regions of the patterns of the first black matrixes 200, a top view being shown in FIG. 7d, wherein the virtual layers 203 cover the partial regions of the patterns of the first black matrixes 200, and the first black matrix 200 is shown in the partial section region B.

It needs to be noted that due to the pattern design of the two-tone mask, the patterns of the virtual layers 203 described above may be formed while the patterns of the first touch electrodes 301 are formed. Although the patterns of the first touch electrodes 301 and the patterns of the virtual layers 203 are arranged in the same layer and formed of the same material, the virtual layers 203 is free of electrical conductivity actually due to the presence of the clearance regions 202, and the signals input to the first touch electrodes 301 are not interfered.

Thus, as the virtual layers 203 and the first touch electrodes 301 are arranged in the same layer and formed of the same material, on the basis of manufacturing the first black matrixes 200, the second black matrixes 201 and the first touch electrodes 301 by using the above method, the color filter layers 101 formed in the above step S103 may be flush with the first touch electrodes 301 and the virtual layers 203, which avoids the defect in the embodiment 1 that, due to the absence of the virtual layers, the color filter layers 101 are flush with the first black matrixes 200 or the second black matrixes 201 to have step differences from the first touch electrodes 301, thus ensuring that the surface, to be aligned and assembled with the array substrate, of the color filter substrate is even. Besides, the embodiment 2 also uses the two-tone mask to carry out the mask exposure process, and the patterns of the first touch electrodes 301 may be manufactured while the patterns of the first black matrixes 200 and the second black matrixes 201 are formed. Therefore, the manufacturing process can be simplified and the production efficiency can be improved. Of course, the aforementioned is merely illustration of two two-tone masks with different pattern designs by way of example. Methods of performing mask exposure by the two-tone mask of other patterns to manufacture the patterns of the first touch electrodes while the patterns of the black matrixes are formed are not illustrated one by one here, but belong to the protection scope of the invention.

Embodiment 3

Figure 8:
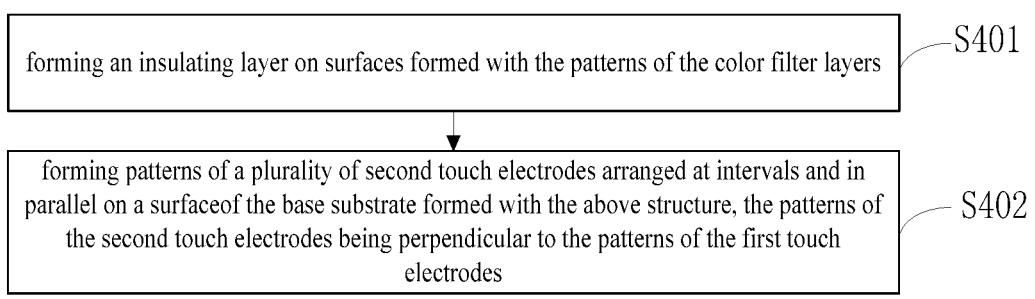
FIG. 8 is a flowchart of a manufacturing method of still another color filter substrate provided in an embodiment of the invention.

Further, after the step S103, the manufacturing method of the color filter substrate, as shown in FIG. 8, may further include the following steps S401 and S402.

S401, an insulating layer (not shown in the figures) is formed on the surface formed with the color filter layers 101.

Figure 9:
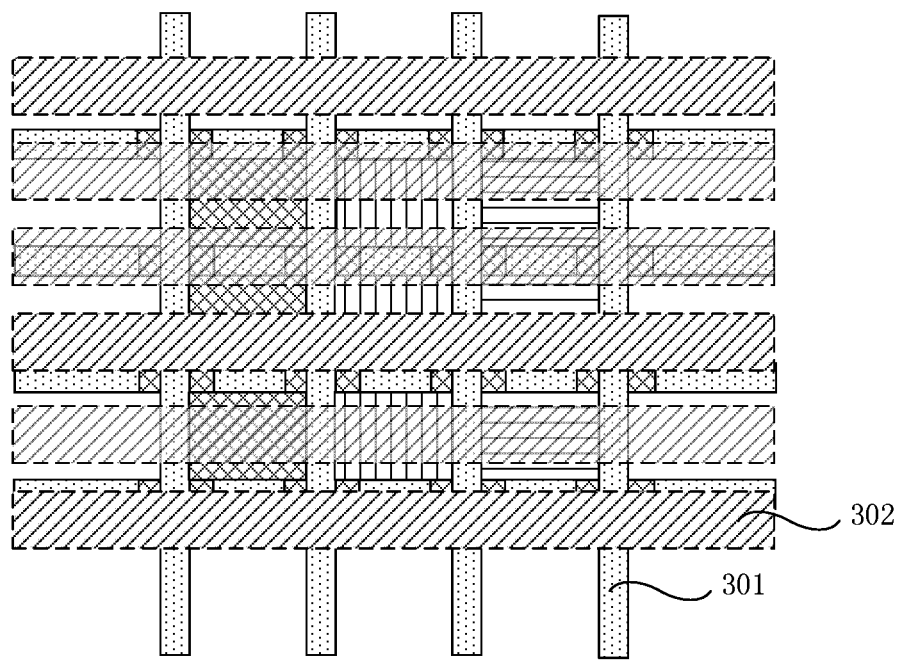
FIG. 9 is a structural diagram of still another color filter substrate provided in an embodiment of the invention.

S402, as shown in FIG. 9, patterns of a plurality of second touch electrodes 302 arranged at intervals and in parallel are formed on a surface of the insulating layer away from the substrate 10. The patterns of the second touch electrodes 302 are perpendicular to the patterns of the first touch electrodes 301.

Thus, when one of the first touch electrode 301 and the second touch electrode 302 is a touch sensing electrode for receiving a sensing signal, and the other is a touch driving electrode for loading a touch driving signal, a mutual capacitor may be formed between the touch sensing electrode and the touch driving electrode, so that when a user contacts the display panel, the electric field of a human body will act on the mutual capacitor to enable variation of the capacitance value of the mutual capacitance, so that the sensing voltage signal coupled by the touch sensing electrode via the mutual capacitor is changed, and thereby a position of a contact point may be determined according to the variation of the sensing voltage signal.

Moreover, when both the first touch electrodes 301 and the second touch electrodes 302 are manufactured on the color filter substrate, compared with the prior art solution in which the touch sensing electrodes are manufactured on the array substrate, no matter which electrodes are used as the touch sensing electrodes for receiving sensing signals, the sensitivity of touch display may be improved since the touch sensing electrodes in the embodiment are closer to the external touch positions.

Preferably, the first touch electrodes 301 may be the touch sensing electrodes for receiving sensing signals; and the second touch electrodes 302 may be the touch driving electrodes for loading touch driving signals. Thus, the touch sensing electrodes are closer to the external touch positions, so that the contact sensitivity of the external touch positions with the touch sensing electrodes can be improved, and interference and noise between the display signals and touch signals of the touch panel are reduced.

Embodiment 4

Of course, the second touch electrodes 302 may also be manufactured on the array substrate to be aligned and assembled with the color filter substrate. In this case, in displaying by the display device, the second touch electrodes 302 may also be used as a common electrode of the display device.

Specifically, during the color filter substrate is manufactured, while the black matrixes (including first black matrixes 200 and second black matrixes 201) of the color filter substrate are formed, the first touch electrodes 301 positioned on the surfaces of the second black matrixes 201 are formed, by using the method of the embodiment 1 or the embodiment 2; during the array substrate is manufactured, a plurality of slit-like electrodes arranged at intervals and in parallel are formed, the patterns of the slot-like electrodes being perpendicular to the patterns of the first touch electrodes 301.Then, the array substrate and the color filter substrate are aligned and assembled, and liquid crystal is filled therein to form a liquid crystal display device.

In displaying by the liquid crystal display device, the slit-like electrodes may be used as a common electrode, so that the liquid crystal deflects in the electric field produced by the common electrode and pixel electrodes to display image. When a user carries out touch control on the display device, the slit-like electrodes may be used as the second touch electrodes 302. When the first touch electrodes 301 on the color filter substrate are touch sensing electrodes for receiving sensing signals, and the second touch electrodes 302 positioned on the array substrate are touch driving electrodes for loading touch driving signals, a user contacts the display device, and the capacitance of the mutual capacitor between the touch sensing electrodes and the touch driving electrodes changes. The position of the contact point is determined according to the variation of the sensing voltage signal so as to complete touch control.

Further, the material constituting the conducting layer (first touch electrode 301) may include a conductive polymeric material; and the material constituting the second touch electrode 302 may include a transparent conductive material, such as indium tin oxide and indium zinc oxide.

Main chain of the conductive polymeric material is formed by alternately arranged single and double bonds. This arrangement delocalizes a bonding molecular orbit and an antibonding molecular orbit along the main chain of molecules. When the bonding molecular orbit or the antibonding molecular orbit is filled or empty by forming charge migration compounds, it is of high conductivity. The conductive polymeric material is characterized in low density, capability to be easily processed, anti-corrosion, capability of large-area filming, low cost, and the conductivity that can be regulated in a range of more than ten orders of magnitudes.

Therefore, when using the conductive polymeric material to manufacture the first touch electrodes 301 as the touch sensing electrodes, high conductivity can be ensured when black matrixes (including first black matrixes 200 and second black matrixes 201) and the first touch electrodes 301 are formed through a single patterning process, thus improving the sensitivity of touch display, and reducing the manufacturing cost.

Specifically, according to the energy band theory, the conductivity of the conductive polymeric material must meet the following two conditions to form band system with whole macromoleculariness: (1) the molecular orbits of macromolecules can be strongly delocalized; (2) the molecular orbits on the macromolecule chain can be overlapped. Polymers meeting the above two conditions include: (1) conjugate polymers, two electrons on the conjugate bond can be delocalized on the whole molecular chain so as to generate and convey carriers; (2) two electron orbits between the molecules in non-conjugate polymers are overlapped; (3) system with the electron donor providing electrons and receptor for receiving electrons.

Preferably, the conductive polymeric material includes at least one of poly(ethylenedioxy thiophene) (PEDOT), poly (p-styrene sulfonate) (PSS), polyaniline, polypyrrole and polythiophene.

The embodiment of the invention provides a color filter substrate, shown in FIG. 3, which may include:

a base substrate 10;

a plurality of first black matrixes 200 and a plurality of second black matrixes 201,which are horizontally and longitudinally intersected and positioned on the surface of the base substrate 10, and a plurality of first touch electrodes 301 positioned on surfaces of the second black matrixes 201 away from the base substrate 10, wherein patterns of the first touch electrodes 301 and the second black matrixes 201 are consistent, and the first black matrixes 200 and the second black matrixes 201 are intersected to define a plurality of color filter regions 100 arranged in a form of matrix; and color filter layers 101 positioned within the color filter regions 100.

The embodiment of the invention provides a color filter substrate, including a base substrate, and a plurality of first black matrixes and second black matrixes which are horizontally and longitudinally intersected and positioned on the surface of the base substrate, and a plurality of first touch electrodes positioned on surfaces of the second black matrixes away from the base substrate, wherein patterns of the first touch electrodes and the second black matrixes are consistent, and the first black matrixes and the second black matrixes are intersected to define a plurality of color filter regions arranged in a form of matrix; and further including color filter layers positioned within the color filter regions. Thus, as the patterns of the first touch electrodes and the second black matrixes are consistent, the first touch electrodes can be manufactured while the black matrixes (including first black matrixes and second black matrixes) are formed, thereby the manufacturing process can be simplified, the manufacturing efficiency is improved and the cost is reduced in manufacturing the display device by using the above color filter substrate.

Further, the color filter substrate may further include:

virtual layers 203, which are positioned on surfaces of the first black matrixes 200 away from the base substrate 10 between patterns of two adjacent first touch electrodes 301.

The virtual layers 203 and the first touch electrodes are of the same layer and same material; in the horizontal direction, a clearance region 202 is formed between a pattern of a virtual layer 203 and an adjacent pattern of the first touch electrode 301.

Thus, not only patterns of the first touch electrodes 301 may be manufactured while the first black matrixes 200 and the second black matrixes 201 are formed, but also the color filter layers 101 positioned within the color filter regions 100 may be flush with the first touch electrodes 301 through the virtual layers 203 arranged in the same layer and formed of the same material as the first touch electrodes 301, thus a surface of the color filter substrate to be aligned and assembled with the array substrate is even. Moreover, due to presence of the clearance regions 202, the virtual layers 203 are non-conductive actually, thus signals input to the first touch electrodes 301 are not interfered.

Further, the color filter substrate may further include:

an insulating layer (not shown in figures) positioned on the surfaces of the color filter layers 101; and a plurality of second touch electrodes 302 arranged at intervals and in parallel on the surface of the insulating layer.

Patterns of the second touch electrodes 302 are perpendicular to the patterns of the first touch electrodes 301.

Thus, when one of the first touch electrode 301 and the second touch electrode 302 is a touch sensing electrode for receiving a sensing signal, and the other is a touch driving electrode for loading a touch driving signal, a mutual capacitor may be formed between the touch sensing electrode and the touch driving electrode, so that when a user contacts the display panel, the electric field of a human body will act on the mutual capacitor to enable variation of the capacitance of the mutual capacitor, so that the sensing voltage signal coupled by the touch sensing electrode via the mutual capacitor is changed, and thereby a position of a contact point may be determined according to the variation of the sensing voltage signal.

Moreover, when both the first touch electrodes 301 and the second touch electrodes 302 are manufactured on the color filter substrate, compared with the prior art solution in which the touch sensing electrodes are manufactured on the array substrate, no matter which electrodes are used as the touch sensing electrodes for receiving sensing signals, the sensitivity of touch display can be improved since the touch sensing electrodes in the embodiment are closer to the external touch positions.

Preferably, the first touch electrodes 301 may be touch sensing electrodes for receiving sensing signals; and the second touch electrode 302 may be touch driving electrodes for loading touch driving signals. Thus, the touch sensing electrodes are closer to the external touch positions, so that the contact sensitivity of the external touch positions with the touch sensing electrodes can be improved, and interference and noise between the display signal and touch signal of the touch panel are reduced.

Of course, the second touch electrode 302 may also be manufactured on the array substrate to be aligned and assembled with the color filter substrate. In this case, in displaying by the display device, the second touch electrodes 302 can also be used as a common electrode of the display device.

Further, the material constituting the patterns of the first touch electrodes 301 may include a conductive polymeric material; and the material constituting the second touch electrodes 302 may include a transparent conductive material, such as indium tin oxide and indium zinc oxide.

Preferably, the conductive polymeric material includes at least one of poly(ethylenedioxy thiophene) (PEDOT), poly (p-styrene sulfonate) (PSS), polyaniline, polypyrrole and polythiophene.

An embodiment of the invention provides a display device, including any one of the color filter substrates described above. The specific structure of the color filter substrate is described in detail in the aforementioned embodiment, which is not repeated here.

It needs to be noted that in the embodiment of the present invention, the display device may be any product or part with the function of display, such as a liquid crystal display, a liquid crystal television, a digital photo frame, a mobile phone or a tablet computer and the like.

The embodiment of the invention provides a display device, including a color filter substrate. The color filter substrate includes a base substrate, a plurality of first black matrixes and a plurality of second black matrixes which are horizontally and longitudinally intersected and positioned on a surface of the base substrate, and a plurality of first touch electrodes positioned on surfaces of the second black matrixes away from the base substrate; wherein the patterns of the first touch electrodes and the second black matrixes are consistent; the first black matrixes and the second black matrixes are intersected to define a plurality of color filter regions arranged in a form of matrix; and further including color filter layers positioned within the color filter regions. Thus, the first touch electrodes can be manufactured while the black matrixes (including first black matrixes and second black matrixes) are formed, thereby the manufacturing process can be simplified and the manufacturing efficiency can be improved in manufacturing the display device by using the above color filter substrate.

The aforementioned are merely specific implementations of the invention. However, the protection scope of the invention is not limited thereto. Any of ordinary skill in the art can easily conceive of variations or substitutions within the technical range disclosed in the invention. These variations or substitutions shall be encompassed within the protection scope of the invention. Therefore, the protection scope of the invention shall be subjected to the protection scope of the appended claims.

The invention claimed is:

1. A manufacturing method of a color filter substrate, comprising steps of:
   forming a light blocking layer and a conducting layer successively on a base substrate;
   performing only a single patterning process on the light blocking layer and the conducting layer to form patterns of a plurality of first black matrixes and a plurality of second black matrixes which are intersected and formed by the light blocking layer, and patterns of a plurality of first touch electrodes positioned on surfaces of the second black matrixes away from the base substrate and formed by the conducting layer, wherein the patterns of the first black matrixes and the second black matrixes are intersected to define a plurality of color filter regions arranged in a form of matrix; and
   forming patterns of color filter layers within the color filter regions,
   wherein the step of performing only a single patterning process on the blocking layer and the conducting layer to form patterns of a plurality of first black matrixes and a plurality of second black matrixes which are intersected and formed by the light blocking layer, and patterns of a plurality of first touch electrodes positioned on surfaces of the second black matrixes away from the base substrate and formed by the conducting layer comprises:
   applying photoresist on a surface of the conducting layer, forming second photoresist completely retained regions, second photoresist partially retained regions and second photoresist completely removed regions by performing a single exposure and development process, wherein the second photoresist completely retained regions correspond to the patterns of the second black matrixes and the first touch electrodes to be formed and partial regions of the patterns of the first black matrixes positioned between the patterns of two adjacent second matrixes, the second photoresist partially retained regions correspond to another partial region of the patterns of the first black matrixes between patterns of two adjacent second black matrix to be formed; and the second photoresist completely removed regions correspond to the color filter regions to be formed;
   etching parts of the conducting layer and the light blocking layer corresponding to the second photoresist completely removed regions to form the color filter regions;
   removing photoresist in the second photoresist partially retained regions, and etching parts of the conducting layer corresponding to the second photoresist partially retained regions to form clearance regions corresponding to another partial regions of the patterns of the first black matrixes; and
   stripping off the photoresist in the second photoresist completely retained regions to form patterns of the first touch electrodes, the second black matrixes and a virtual layer corresponding to the partial regions of the patterns of the first black matrixes, wherein
   the partial regions of the patterns of the first black matrixes do not contact the patterns of the second black matrixes,
   the virtual layer and the first touch electrodes are of a same material and arranged in a same layer, and in an extension direction of the first black matrixes, a clearance region is formed between pattern of the virtual layer and the patterns of the first touch electrodes, and the pattern of the virtual layer is spaced apart by the color filter regions in an extension direction of the second black matrixes and is free of electrical conductivity.

2. The manufacturing method of the color filter substrate according to claim 1, wherein after the step of forming the color filter layers within the color filter regions, the method further comprises:
   forming an insulating layer on surfaces formed with the patterns of the color filter layers;
   forming patterns of a plurality of second touch electrodes arranged at intervals and in parallel on a surface of the insulating layer away from the base substrate, the patterns of the second touch electrodes being perpendicular to the patterns of the first touch electrodes.

3. The manufacturing method of the color filter substrate according to claim 1, wherein the first touch electrodes are touch sensing electrodes for receiving sensing signals; and second touch electrodes are touch driving electrodes for loading touch driving signals.

4. The manufacturing method of the color filter substrate according to claim 2, wherein the first touch electrodes are touch sensing electrodes for receiving sensing signals; and the second touch electrodes are touch driving electrodes for loading touch driving signals.

5. The manufacturing method of the color filter substrate according to claim 3, wherein material constituting the conducting layer comprises a conductive polymeric material; and a material constituting the second touch electrodes comprises a transparent conductive material.

6. The manufacturing method of the color filter substrate according to claim 4, wherein material constituting the conducting layer comprises a conductive polymeric material; and a material constituting the second touch electrodes comprises a transparent conductive material.

7. The manufacturing method of the color filter substrate according to claim 5, wherein the conductive polymeric material comprises at least one of poly(ethylenedioxy thiophene), poly(p-styrene sulfonate), polyaniline, polypyrrole and polythiophene.

8. The manufacturing method of the color filter substrate according to claim 6, wherein the conductive polymeric material comprises at least one of poly(ethylenedioxy thiophene), poly(p-styrene sulfonate), polyaniline, polypyrrole and polythiophene.

9. The manufacturing method of the color filter substrate according to claim 1, wherein after the step of forming the patterns of the color filter layers within the color filter regions, the method further comprises forming a protective layer on the color filter layers.

10. A color filter substrate, comprising:
a base substrate;
a plurality of first black matrixes and a plurality of second black matrixes which are intersected and positioned on a surface of the base substrate, and a plurality of first touch electrodes positioned on surfaces of the second black matrixes away from the base substrate, wherein the patterns of the first touch electrodes and the second black matrixes are consistent, and the first black matrixes and the second black matrixes are intersected to define a plurality of color filter regions arranged in a form of matrix;
color filter layers positioned within the color filter regions; and
a virtual layer which is positioned on surfaces of the first black matrixes away from the base substrate between patterns of two adjacent first touch electrodes,
wherein the virtual layer and the first touch electrodes are of a same material and arranged in a same layer; and in an extension direction of the first black matrixes, a clearance region is formed between the pattern of the virtual layer and the pattern of the first touch electrode, and the pattern of the virtual layer is spaced apart by the color filter regions in an extension direction of the second black matrixes and is free of electrical conductivity.

11. The color filter substrate according to claim 10, further comprising:
an insulating layer positioned on surfaces of the color filter layers; and
a plurality of second touch electrodes arranged at intervals and in parallel on the surface of the insulating layer;
wherein patterns of the second touch electrodes are perpendicular to the patterns of the first touch electrodes.

12. The color filter substrate according to claim 10, wherein the first touch electrodes are touch sensing electrodes for receiving sensing signals; and the second touch electrodes are touch driving electrodes for loading touch driving signals.

13. The color filter substrate according to claim 11, wherein the first touch electrodes are touch sensing electrodes for receiving sensing signals; and the second touch electrodes are touch driving electrodes for loading touch driving signals.

14. The color filter substrate according to claim 12, wherein the material constituting the patterns of the first touch electrodes comprise a conductive polymeric material; and the material constituting the second touch electrodes comprise a transparent conductive material.

15. The color filter substrate according to claim 14, wherein the conductive polymeric material comprises at least one of poly(ethylenedioxy thiophene), poly(p-styrene sulfonate), polyaniline, polypyrrole and polythiophene.

16. The color filter substrate according to claim 10, further comprising a protective layer formed on the color filter layers.

17. A display device, comprising the color filter substrate according to claim 10.

18. A manufacturing method of a color filter substrate, comprising steps of:
forming a light blocking layer and a conducting layer successively on a base substrate;
performing only a single patterning process on the light blocking layer and the conducting layer to form patterns of a plurality of first black matrixes and a plurality of second black matrixes which are intersected and formed by the light blocking layer, and patterns of a plurality of first touch electrodes positioned on surfaces of the second black matrixes away from the base substrate and formed by the conducting layer, wherein the patterns of the first black matrixes and the second black matrixes are intersected to define a plurality of color filter regions arranged in a form of matrix; and
forming patterns of color filter layers within the color filter regions,
wherein the step of performing only a single patterning process on the light blocking layer and the conducting layer to form patterns of a plurality of first black matrixes and a plurality of second black matrixes which are intersected and formed by the light blocking layer, and patterns of a plurality of first touch electrodes positioned on surfaces of the second black matrixes away from the base substrate and formed by the conducting layer comprises:
applying photoresist on a surface of the conducting layer;
forming first photoresist completely retained regions, first photoresist partially retained regions and first photoresist completely removed regions by performing a single exposure and development process, wherein the first photoresist completely retained regions correspond to the patterns of the second black matrixes and the first touch electrodes to be formed; the first photoresist partially retained regions correspond to the patterns of the first black matrixes to be formed; and the first photoresist completely removed regions correspond to the color filter regions to be formed;
etching parts of the conducting layer and the light blocking layer corresponding to the first photoresist completely removed regions to form the color filter regions;
removing the photoresist in the first photoresist partially retained regions, and etching parts of the conducting layer corresponding to the first photoresist partially retained regions to form the patterns of the first black matrixes; and
stripping off the photoresist in the first photoresist completely retained regions to form the patterns of the first touch electrodes and the second black matrixes.

* * * * *